United States Patent [19]
Takahashi et al.

[11] Patent Number: 5,395,037
[45] Date of Patent: * Mar. 7, 1995

[54] METHOD AND APPARATUS FOR PERFORMING WIRE BONDING BY USING SOLDER WIRE

[75] Inventors: Hiroyuki Takahashi; Shinichi Fujino; Kazuhiro Sakamoto, all of Kyoto; Tomoyasu Hirano, Yanagawa, all of Japan

[73] Assignee: Rohm Co., Ltd., Kyoto, Japan

[*] Notice: The portion of the term of this patent subsequent to Mar. 22, 2011 has been disclaimed.

[21] Appl. No.: 169,625

[22] Filed: Dec. 20, 1993

Related U.S. Application Data

[63] Continuation of Ser. No. 63,667, May 20, 1993, Pat. No. 5,295,619.

[30] Foreign Application Priority Data

Apr. 22, 1992 [JP] Japan .................. 4-130746
Feb. 16, 1993 [JP] Japan .................. 5-026800

[51] Int. Cl.⁶ .................. H01L 21/60; B23K 35/38
[52] U.S. Cl. .................. 228/180.5; 228/219
[58] Field of Search .................. 228/173.5, 180.5, 219, 228/220, 4.5, 42; 219/56.22, 74

[56] References Cited

U.S. PATENT DOCUMENTS

| | | | |
|---|---|---|---|
| 4,387,283 | 6/1983 | Peterson et al. | 228/4.5 |
| 4,390,771 | 6/1983 | Kurtz et al. | |
| 4,705,204 | 11/1987 | Hirota et al. | 228/180.5 |
| 4,814,855 | 3/1989 | Hodgson et al. | 228/180.21 |
| 4,889,274 | 12/1989 | Ramsey | 228/180.5 |
| 5,295,619 | 3/1994 | Takahashi et al. | 228/180.5 |

FOREIGN PATENT DOCUMENTS

| | | |
|---|---|---|
| 0169574 | 1/1986 | European Pat. Off. . |
| 0265927 | 5/1988 | European Pat. Off. . |
| 2353100 | 5/1974 | Germany . |
| 4129933 | 3/1992 | Germany . |
| 55-118643 | 9/1980 | Japan . |
| 62-136835 | 6/1987 | Japan . |
| 63-40330 | 2/1988 | Japan . |
| 88/04829 | 6/1988 | WIPO . |

*Primary Examiner*—Samuel M. Heinrich
*Attorney, Agent, or Firm*—William H. Eilberg

[57] ABSTRACT

A method for bonding a solder wire is provided wherein a lower ball end of a material solder wire is first bonded to a first bonding portion of a workpiece. Then, the material solder wire is thermally cut to provide a solder wire segment held bonded to the first bonding portion and having an upper ball end. Finally, the upper ball end is bonded to a second bonding portion of the workpiece. All of the wire bonding process steps are performed in an oxygen-free atmosphere to prevent oxidation of the solder wire.

13 Claims, 8 Drawing Sheets

METHOD AND APPARATUS FOR PERFORMING WIRE BONDING BY USING SOLDER WIRE

This is a continuation of application Ser. No. 08/063,667, filed May 20, 1993, now U.S. Pat. No. 5,295,619.

BACKGROUND OF THE INVENTION

1. Field of the Invention

This invention relates to the wire bonding technology in general. More specifically, the present invention relates to a method and apparatus for electrically connecting between two different portions of a workpiece (e.g. a leadframe or printed circuit board to which electronic components are mounted) by a solder wire.

2. Description of the Prior Art

In electronic circuits or components, it is usually necessary to electrically connect between two different portions of a workpiece. For instance, a lead of a semiconductor chip device need be electrically connected to a relevant bonding pad of the chip body through a metal wire.

In wire bonding, generally, a gold or aluminum wire is melted at both ends to form balls which are subsequently utilized for strong attachment to two different portions of a workpiece. Such a wire bonding method, which is called "ball bonding", is possible because either gold or aluminum has a high melting point and is reluctantly oxidized.

If the melting point of a metal wire is low, it is difficult to control ball formation (with respect to the ball diameter for example) at the time of thermally cutting a material metal wire by a gas torch (burning with hydrogen gas for example). Further, if the metal wire is easily oxidized at the time of ball formation, the metal wire fails to provide a sufficiently strong and reliable connection to the workpiece.

On the other hand, it has been recently proposed to use a solder wire for wire bonding in place of a gold or aluminum wire, because solder is known to be less costly than either gold or aluminum. Further, a solder wire is also advantageous in that it can be made to have an additional function as a temperature fuse (or as a combined temperature/overcurrent fuse) since the melting point of solder is relatively low.

However, the low melting point of solder makes it difficult to control ball formation at both ends of a solder wire. Further, solder is known to be oxidized very easily at the time of melting. Thus, it has been believed impractical to applying the ball bonding method to the solder wire.

In a wire bonding method using a solder wire, therefore, two different methods are conventionally used for bonding the solder wire. A first method is the soldering method wherein a separate bonding solder layer is formed between each end of the solder wire and a relevant portion of a workpiece. A second method is the so-called "wedge bonding" method wherein each end of the solder wire is compressed by a bonding tool for flattening at the time of bonding to the workpiece.

However, the soldering method requires the use of solder in addition to the solder wire itself to result in a material waste. More importantly, the wire bonding process cannot be performed quickly and efficiently by the soldering method. Further, the soldering method cannot be applied when the interval between the bonding points is narrow.

On the other hand, the wedge bonding method has no problem of material waste and is applicable even when the interval between the bonding points is narrow. However, compared with the ball bonding method, there is a greater limitation in increasing the bonding area by flattening the wire end, so that it is difficult to obtain a sufficient bonding strength. Further, the flattened end portion of the wire is rather thin and easy to break, resulting in a quality deterioration of the products.

SUMMARY OF THE INVENTION

It is, therefore, an object of the present invention to provide a wire bonding method wherein a solder wire, as a wire bonding metal, is made to have a ball at each end without involving the problem of oxidation to enable reliable bonding to a workpiece.

Another object of the invention is to provide an apparatus which is suitable for performing such a wire bonding method.

According to one aspect of the present invention, there is provided a wire bonding method for electrically connecting between a first and a second bonding portions of a workpiece by a solder wire, the method comprising the steps of: forming an upward stream of an oxygen-free gas from below a vertically movable capillary tool, the capillary tool being capable of continuously supplying a material solder wire which has a lower ball end projecting from the capillary tool; lowering and then raising the capillary tool for bonding the lower ball end of the material solder wire to the first bonding portion of the workpiece in the oxygen-free gas stream; bringing a thermal melting means to a first limit position located closest to the material solder wire for thermally cutting the material solder wire in the oxygen-free gas stream to provide a solder wire segment held bonded to the first bonding portion of the workpiece and having an upper ball end, the thermal melting means being movable also to a second limit position located farthest from the material solder wire; forming a new lower ball end of the material solder wire in the oxygen-free gas stream while the thermal melting means is positioned between the first and second limit positions; and bonding the upper ball end of the solder wire segment to the second bonding portion of the workpiece.

According to another aspect of the present invention, there is provided a wire bonding apparatus for electrically connecting between a first and a second bonding portions of a workpiece by a solder wire, the apparatus comprising: a tunnel through which the workpiece is transferred; a supply means for supplying an oxygen-free gas to the tunnel; a discharge means for discharging the oxygen-free gas in an upward stream from the tunnel; a vertically movable capillary tool arranged above the discharge means for holding and supplying a material solder wire, the capillary tool serving also as a first bonding tool for bonding a lower ball end of the material solder wire to the first bonding portion of the workpiece; a thermal melting means movable to a first limit position closest to the material solder wire for thermally cutting the material solder wire under the capillary tool to provide a solder wire segment held bonded to the first bonding portion of the workpiece and having an upper ball end, the melting means being further capable of forming a new lower ball end of the material solder wire before moving to a second limit position farthest from the material solder wire; and a second bonding tool for bonding the upper ball end of the solder wire segment to the second bonding portion of the workpiece.

Other objects, features and advantages of the present invention will become apparent from the following detailed description of the preferred embodiments given with reference to the accompanying drawings.

DETAILED DESCRIPTION OF THE PREFERRED EMBODIMENTS

Figure 14:
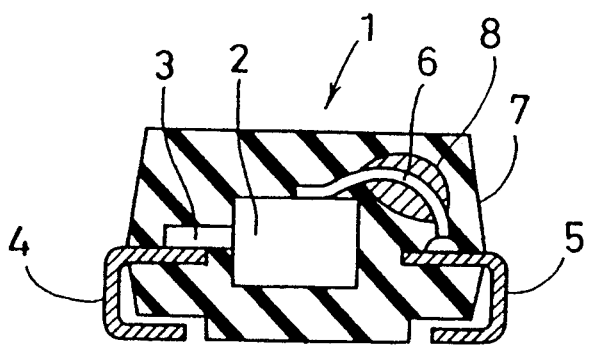
FIG. 14 is a sectional view showing a solid electrolytic capacitor to which the present invention invention can be advantageously applied.

FIG. 14 of the accompanying drawings shows a tantalum solid electrolytic capacitor 1 as an example to which the present invention can be advantageously applied. However, the present invention may be also applied to any electronic components or circuits which require wire bonding.

The capacitor 1 comprises a capacitor element 2 having a projecting anode wire 3. The capacitor 1 further comprises an anode lead 4 electrically connected to the anode wire 3 by welding for example, and a cathode lead 5 electrically connected to the chip body of the capacitor element 2 through a safety fuse wire 6 which may be designed to break at a specified temperature or upon passage of a specified overcurrent. The safety fuse wire 6 is partially enclosed in a relatively soft arc-extinguishing member 8 which may be made of silicone resin.

The capacitor element 2 together with the safety fuse wire 6 and part of the respective leads 4, 5 is enclosed in a protective package 7 which is made of a relatively hard resin such as epoxy. The projecting portions of the respective leads 4, 5 are bent to be located under the protective package.

In the illustrated embodiment, the safety fuse wire 6 is made of solder. It is this solder wire 6 that is bonded to the chip body of the capacitor element 2 and to the cathode lead 5 according to the method of the present invention.

In manufacture, use is made of a leadframe 10 (see FIGS. 1–13) for successively making a plurality of solid electrolytic capacitors having the above-described configuration. As best shown in FIG. 4, the leadframe 10 has a plurality of integral anode leads 4 suitably spaced longitudinally of the leadframe, and a plurality of integral cathode leads 5 spaced also longitudinally of the leadframe in corresponding relation to the anode leads 4 for pairing therewith. A capacitor element 2 is mounted to the leadframe 10 by fixing the anode wire 3 to each anode lead 4.

For performing the wire bonding method according to the present invention, the leadframe 10 is transferred longitudinally (in the direction of an arrow A in FIGS. 1 and 2) but intermittently at a pitch corresponding to the interval between the pairs of anode and cathode leads 4, 5. As a result, the leadframe 10 is made to move successively through first to fourth process stations B–E (see FIGS. 1 and 2).

A transfer path of the leadframe 10 is mainly provided by a combination of a heater block 11 and a cover member 12. Specifically, a tunnel 13 is defined between the heater block 11 and the cover member 12, and the leadframe 10 is caused to pass substantially horizontally through the tunnel 13 (see FIGS. 1–4). The heater block 11 is supported by a machine frame (not shown) and internally provided with a heater (not shown) for heating the leadframe 10 to a suitable temperature.

The tunnel 13 communicates with gas supply pipes 14 (see FIGS. 1 and 3) connected to the underside of the heater block 1. During the bonding operation, a reducing gas (containing nitrogen gas mixed with about 4–5% of hydrogen gas for example) is supplied to the tunnel 13 from below through the gas supply pipes 14. Thus, the oxygen-free atmosphere created by the reducing gas prevents the leadframe 10 from being oxidized at the time of passing through the tunnel 13 which is heated to a relatively high temperature by the heater block 11. It should be appreciated that the reducing gas may be replaced by any other oxygen-free gas such as an inert gas (containing only nitrogen gas or argon gas for example).

Figure 1:
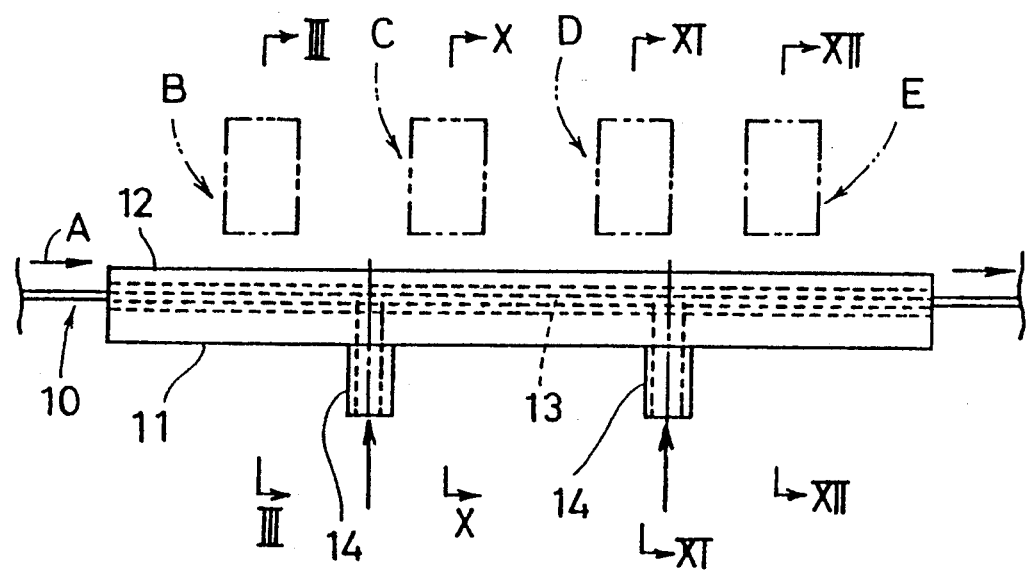
FIG. 1 is a schematic front view showing an apparatus used for performing a wire bonding method according to the present invention.
Figure 2:
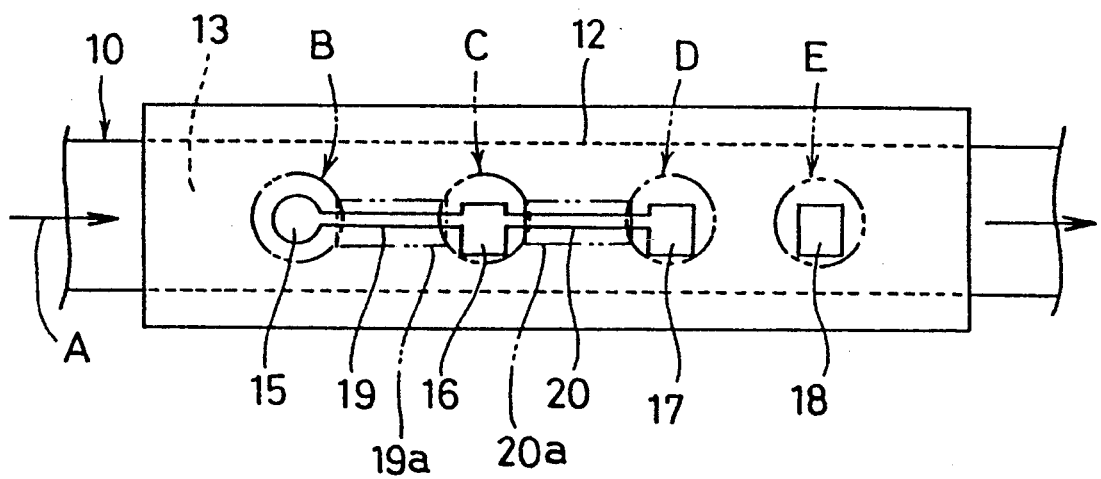
FIG. 2 is a schematic plan view of the same apparatus.

The cover member 12 is provided with first to fourth outlet openings 15–18 at positions corresponding to the first to fourth process stations B–E (see particularly FIG. 2). Thus, the reducing gas supplied from the gas supply pipes 14 discharges upwardly through the respective outlet openings 15–18. As a result, an oxygen-free atmosphere is also created above the respective outlet openings 15–18.

As shown in FIG. 2, a first slit 19 is formed in the cover member 12 to connect between the first and second outlet openings 15, 16, whereas a second slit 20 is formed in the cover member 12 to connect between the second and third outlet openings 16, 17. Further, the first and second slits 19, 20 are covered respectively by a first and a second roof members 19a, 20a, so that the reducing gas is prevented from discharging through the respective slits 19, 20.

Figure 3:
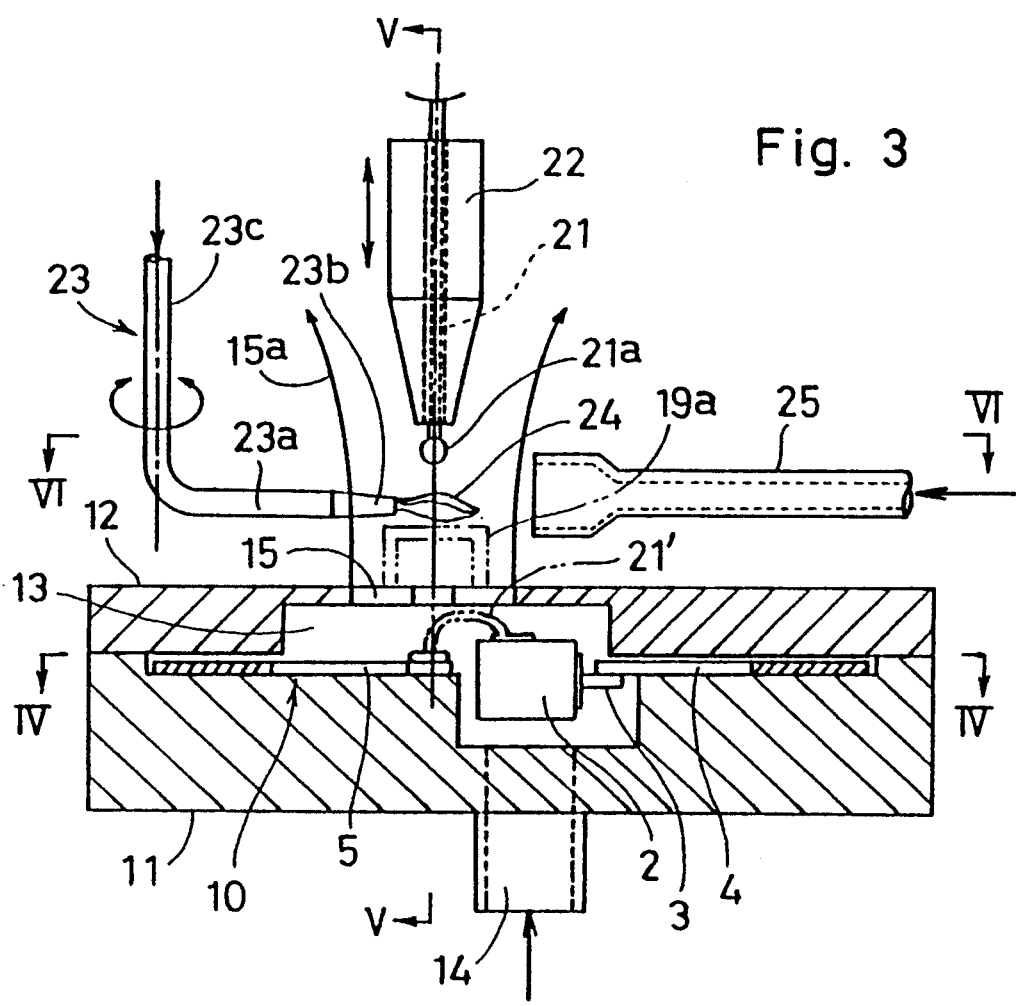
FIG. 3 is an enlarged sectional view taken along lines III—III in FIG. 1.
Figure 4:
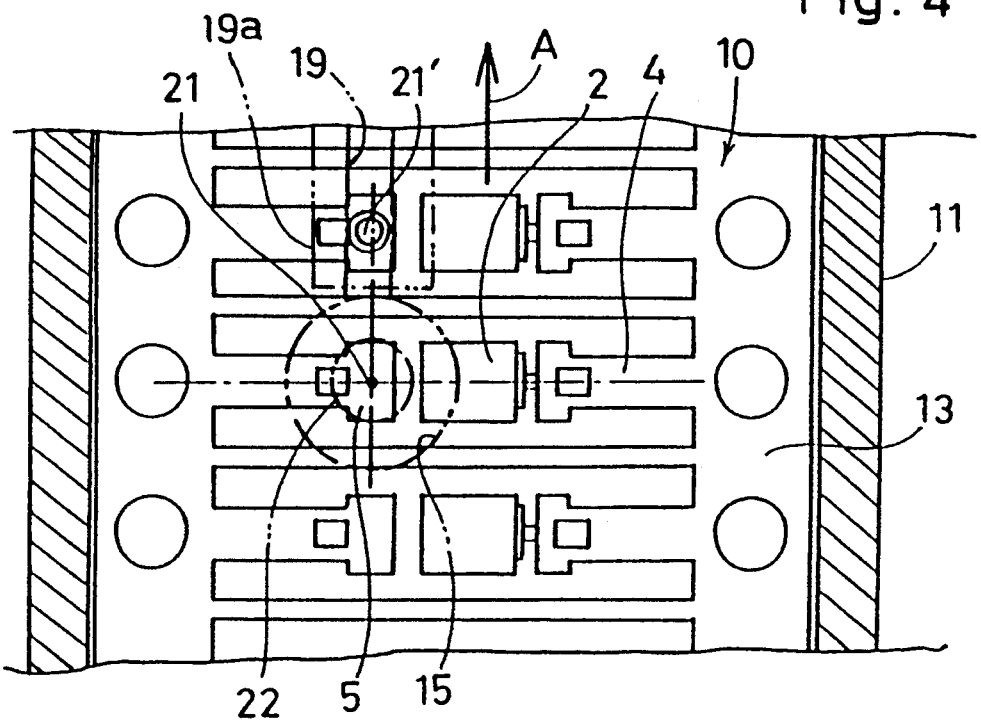
FIG. 4 is a sectional view taken along lines IV—IV in FIG. 3.
Figure 5:
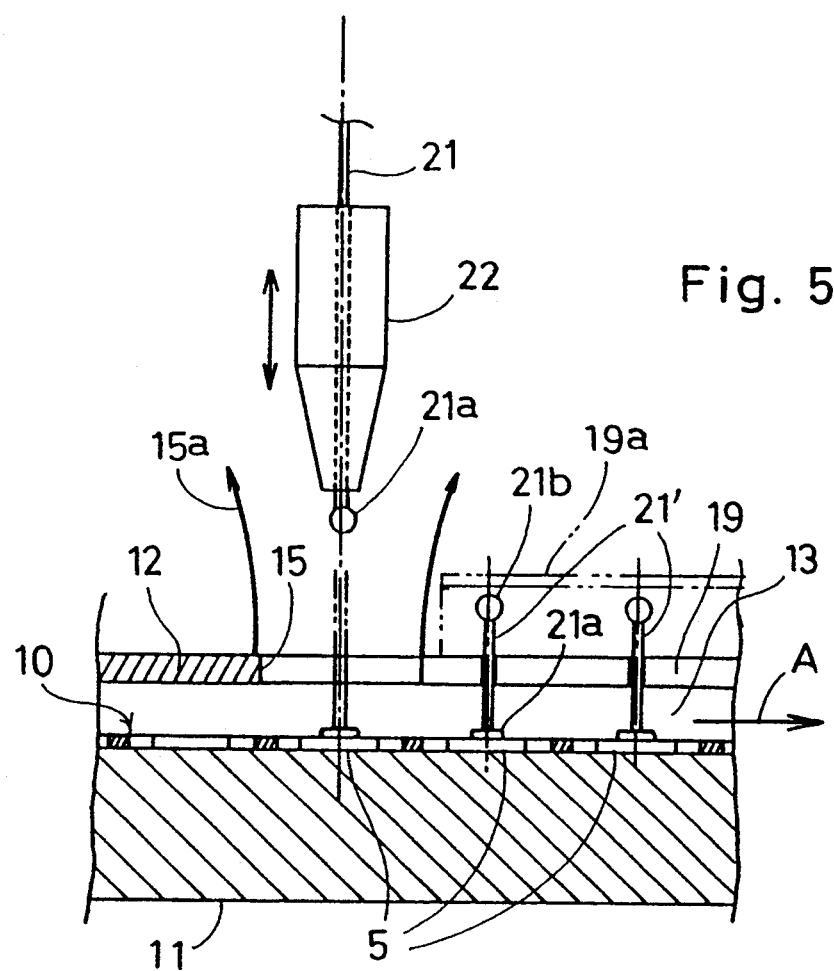
FIG. 5 is a sectional view taken on lines V—V in FIG. 3.

At the first process station B, a vertically movable capillary tool 22 is arranged above the first outlet opening 15, as shown in FIG. 3. The capillary tool 22 holds and supplies a continuous material solder wire 21 therethrough.

The capillary tool 22 is associated with an L-shaped torch 23. This torch includes a horizontal pipe portion 23a with a nozzle tip 23b, and a vertical pipe portion 23c extending perpendicularly to the horizontal pipe portion 23a. The nozzle tip 23b forms a flame 24 generated by burning of hydrogen gas.

Figure 6:
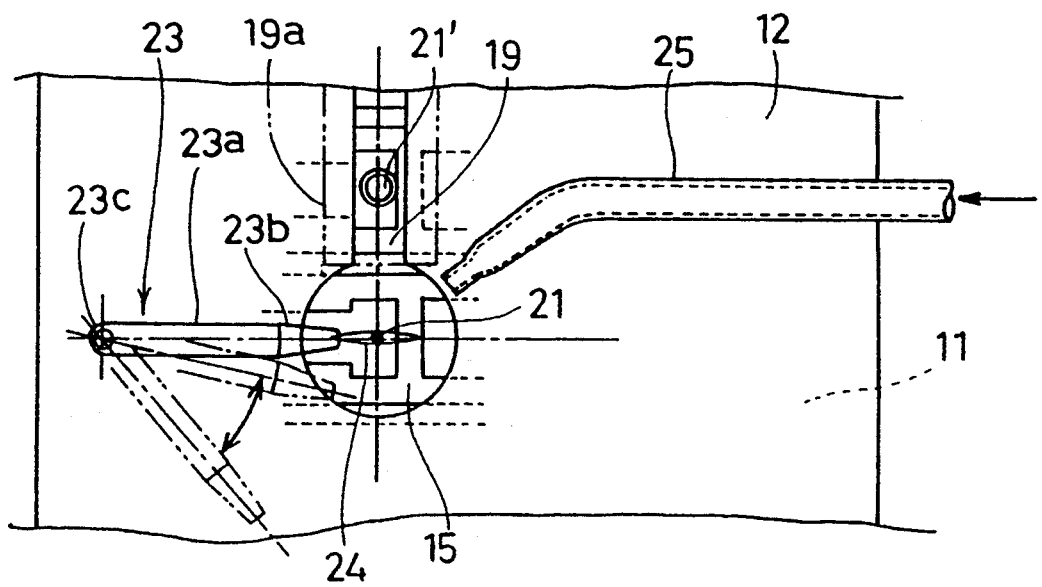
FIG. 6 is a sectional view taken along lines VI—VI in FIG. 3.

As shown in FIG. 6, the torch 23 is pivotable about the vertical pipe portion 23c thereof to assume different pivotal positions. These positions include a first limit position (indicated by the solid lines in FIG. 6) for directing the flame 24 toward the material solder wire 21, an intermediate position (indicated by the single-dot chain line in FIG. 6) which angularly deviates slightly from the first limit position, and a second limit position (indicated by the double-dot chain line in FIG. 6) located angularly farther from the first limit position than the intermediate position.

Further, the capillary tool 22 is also associated with a coolant supply nozzle 25 disposed above the first outlet opening 15 for discharging a coolant gas toward the material solder wire 21 at a relatively low temperature. The coolant gas may be of the reducing nature, so that it may have the same composition as the reducing gas supplied to the tunnel 13.

The following operations are performed for wire bonding which starts at the first process station B. It should be appreciated that the reducing gas is always supplied to the tunnel 13 throughout the entire process steps described below.

Figure 7:
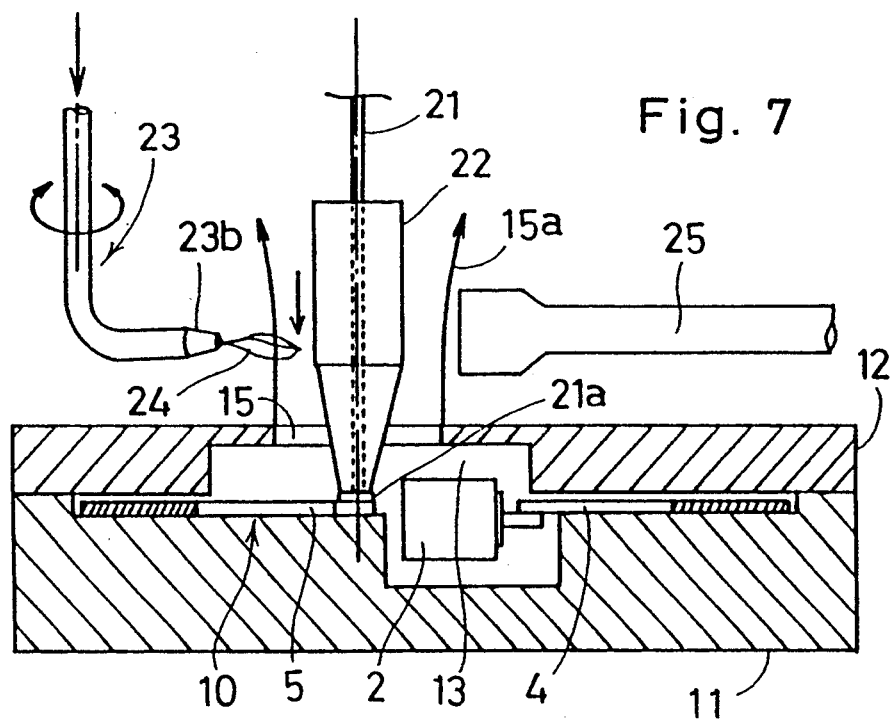
FIG. 7 is a sectional view similar to FIG. 3 but showing how to perform a first bonding step.

First, in the first process station B, the lower end 21a of the material solder wire 21, which has been previously formed into a ball (see FIGS. 3 and 5), is bonded to a selected one of the cathode leads 5 by lowering the capillary tool 22 for pressing the ball end 21a to the cathode lead 5 under application of heat (provided by the heater block 11) and/or ultrasonic vibration, as shown in FIG. 7. As a result, the wire ball end 21a is deformed to have a nail head shape. At this time, the torch 23 is pivoted to the second limit position (the double-dot chain line position in FIG. 6) to bring the torch flame 24 out of interference with the capillary tool 22.

Figure 8:
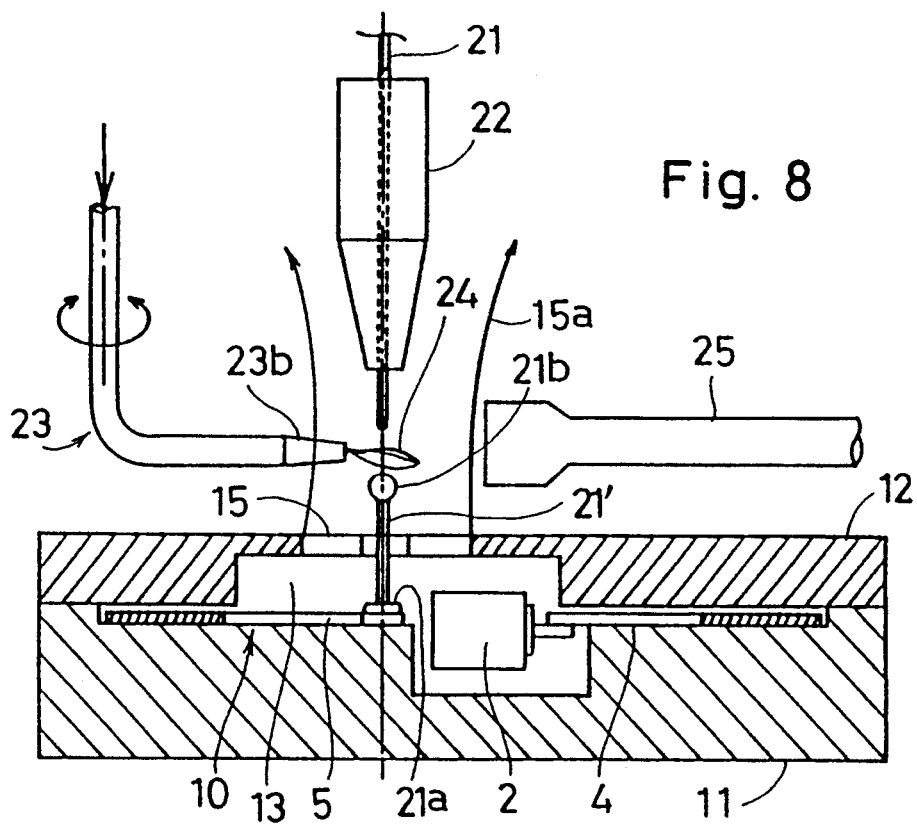
FIG. 8 is a sectional view also similar to FIG. 3 but showing how to cut a solder wire.

Then, in the first process station B, the capillary tool 22 is raised while allowing the material solder wire 21 to be paid out, as shown in FIG. 8. When the capillary tool is raised by a predetermined amount, the torch 23 is pivoted to the first limit position (the solid line position in FIG. 6) for thermally cutting the material solder wire 21 by the flame 24. As a result, a shorter segment 21' connected at the nail head end 21a to the cathode lead 5 is separated from the rest of the material solder wire 21 and made to have an upper ball end 21b which is formed by the surface tension of the melted solder portion. At this time, since the formation of the upper ball end 21b is performed in an upward reducing gas flow 15a discharging through the first outlet opening 15, it is possible to prevent oxidation of the ball end 21b.

At the time of thermally cutting, no ball is formed at the lower end of the material solder wire 21 remaining on the capillary tool 22, as shown in FIG. 8. The reason for this is that the melted portion of the material solder wire 21 is drawn only to the separated wire segment 21' due to the gravity combined with the surface tension of the melted wire portion.

Figure 9:
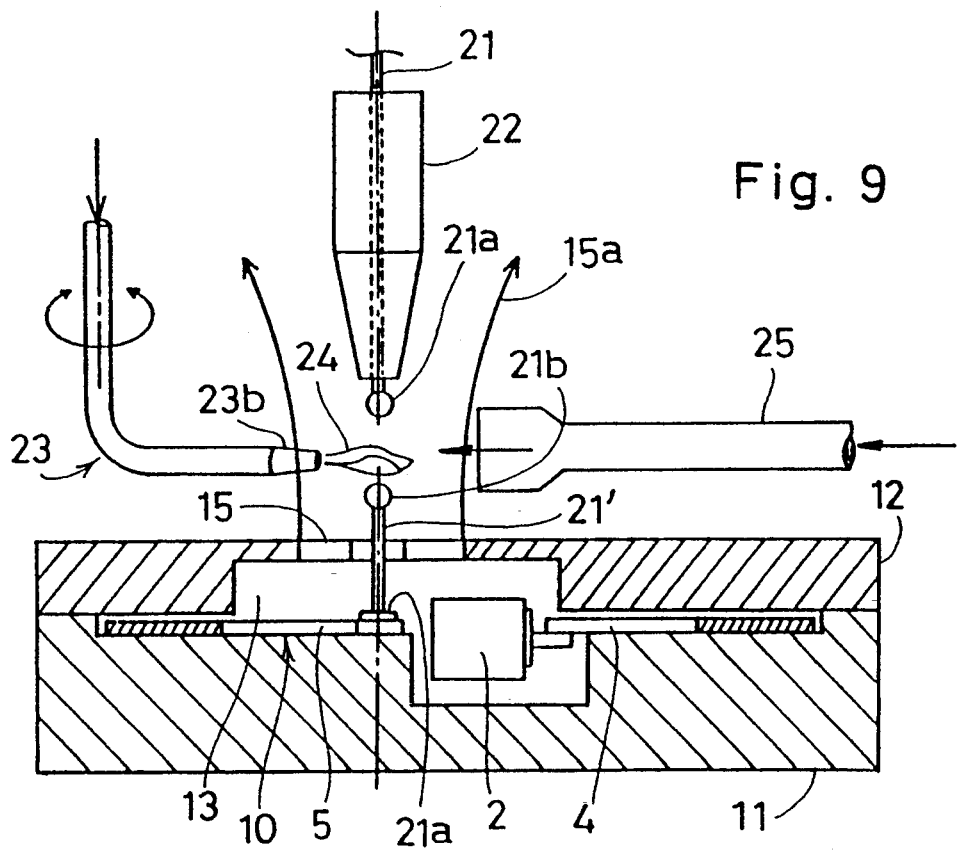
FIG. 9 is a sectional view again similar to FIG. 3 but showing how to form a new lower ball end for the solder wire.

In the next process step at the first process station B, the torch 23 is pivotally brought to the intermediate position (the single-dot chain line position in FIG. 6) and held there for a predetermined time. In the intermediate pivotal position of the torch 23, the flame 24 is still relatively close to the material solder wire 21, and the heat generated by the flame 24 is carried up by the upward flow 15a of the reducing gas. Thus, the upwardly directed heat of the flame 24 is enough to cause melting at the new lower end 21a of the material solder wire 21 but insufficient to cause re-melting of the upper ball end 21b of the separated wire segment 21'. As a result, the lower end 21a of the material solder wire 21 is formed into a new ball, as shown in FIG. 9. Obviously, the upward reducing gas flow 15a prevents oxidation of the respective balls 21a, 21b during this process step.

Instead of bringing the torch 23 immediately to the predetermined intermediate position (the single-dot chain line position in FIG. 6) and holding it there for a predetermined time, the torch 23 may be pivoted toward the second limit position (the double-dot chain line position in FIG. 6) at a relatively low speed. According to this alternative, the lower end 21a of the material solder wire 21 may be formed into a new ball while the torch 23 moves slowly away from the material solder wire.

As also illustrated in FIG. 9, the low temperature coolant gas is supplied through the coolant supply nozzle 25 slightly after completing the formation of the respective ball ends 21a, 21b. At this time, the torch 23 is pivoted to the second limit position (the double-dot chain line position in FIG. 6). As a result, the respective ball ends 21a, 21b solidify in an accelerated manner, so that it is possible to speed up the wire bonding process as a whole. Apparently, the reducing nature of the coolant gas prevents oxidation of the ball ends 21a, 21b during such solidification.

After completing the solidification of the respective ball, the leadframe 10 is advanced by an amount corresponding to the pitch between the pairs of anode and cathode leads 4, 5 for performing similar wire bonding with respect to the next cathode lead 5. In the advancing movement of the leadframe, the solder wire segment 21' standing upright through the first slit 19 is allowed to pass under the first roof member 19a.

Figure 10:
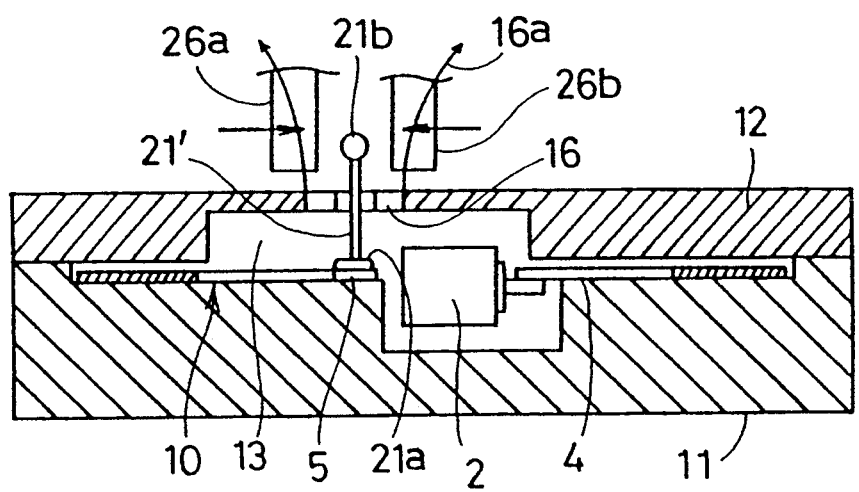
FIG. 10 is a sectional view taken on lines X—X in FIG. 1.
Figure 11:
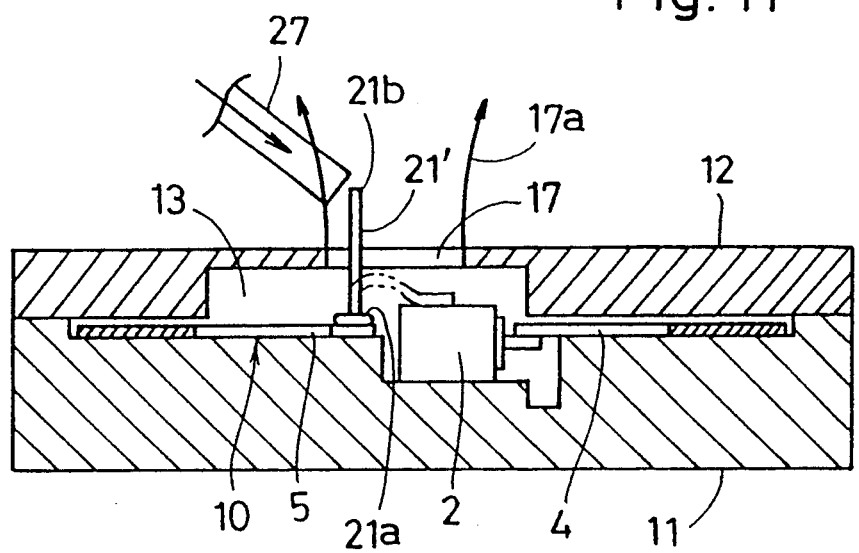
FIG. 11 is a sectional view taken along lines XI—XI in FIG. 1.

In the second process station C, the upper ball end 21b of the solder wire segment 21' is flatten into a generally discal form by compressing between a pair of clamp members 26a, 26b, as shown in FIG. 10. At this time, an upward reducing gas flow 16a discharging through the second outlet opening 16 prevents oxidation of the upper ball end 21b. Upon completion of the flattening operation, the leadframe 10 is further advanced, so that the solder wire segment 21' moves toward the third process station D by passing through the second slit 20 under the second roof member 20a (FIG. 2).

Figure 12:
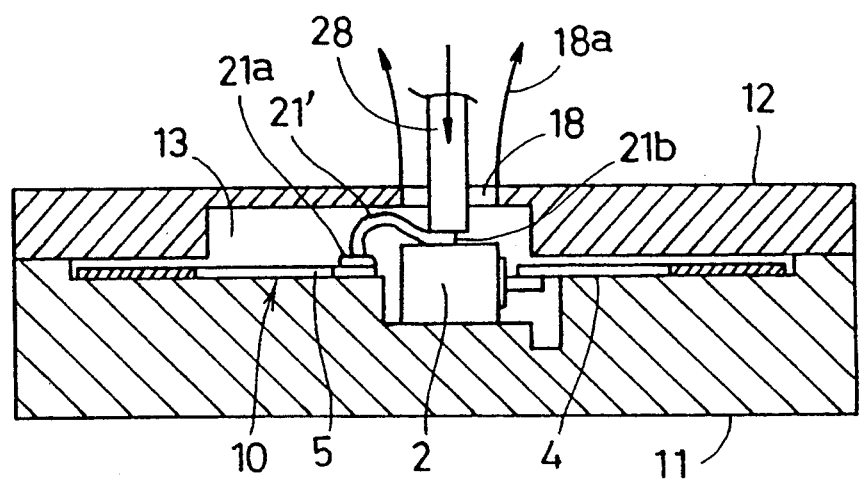
FIG. 12 is a sectional view taken along lines XII—XII in FIG. 1.

In the third process station D, the flattened upper end 21b of the solder wire segment 21' is bent toward the chip body of the capacitor element 2 by advancing a reciprocative bending tool 27, as illustrated in FIG. 12. During this bending operation, an upward reducing gas flow 17a discharging through the third outlet opening 17 prevents oxidation of the flattened upper end 21b. Upon completion of the bending operation, the leadframe 10 is further advanced toward the fourth process station E (FIG. 2).

Finally, in the fourth process station E, the flattened upper end 21b of the solder wire segment 21' is pressed against the chip body of the capacitor element 2 under application of heat and/or ultrasonic vibration by a vertically movable bonding tool 28, as shown in FIG. 12. As a result, the flattened end 21b is electrically bonded to the capacitor chip body. During this bonding operation, an upward reducing gas flow 18a discharging through the fourth outlet opening 18 prevents oxidation of the flattened upper end 21b. Apparently, the previous flattening of the upper end 21b increases the adhesion area, thus providing a stronger bonding force relative to the chip body of the capacitor element 2.

Figure 13:
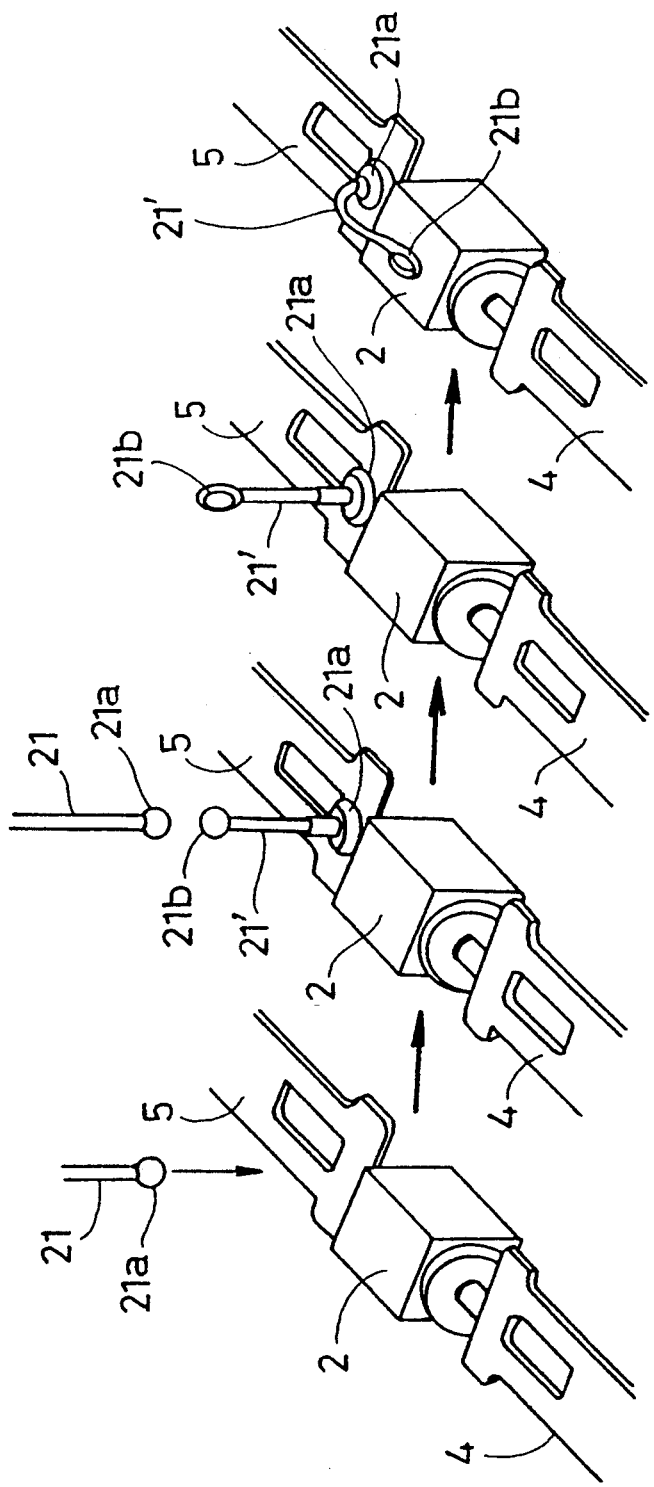
FIG. 13 is a perspective view showing the successive process steps of performing the method according to the present invention.

FIG. 13 illustrates, in a summarized version, the successive process steps for conducting the wire bonding method according to the present invention. It is important for the present invention that all of the wire bonding process steps are performed in an oxygen-free atmosphere (particularly, a reducing atmosphere) for preventing oxidation of the solder wire. Further, since the oxygen-free gas is introduced into the tunnel 13, which is used for passage of the leadframe 10, before discharging through the respective outlet openings 15–18, the gas can be also utilized for preventing oxidation of the leadframe 10 with a minimum amount of the gas but without requiring a separate gas feeding system.

The present invention being thus described, it is obvious that the same may be varied in many ways. For instance, the present invention may be applied for bonding between a semiconductor chip and a wiring conductor pattern of a printed circuit board. Further, the torch 23 may be replaced by an electric heater or a steam of heated inert gas. Such variations are not to be regarded as a departure from the spirit and scope of the the invention, and all such modifications as would be obvious to those skilled in the art are intended to be included within the scope of the following claims.

We claim:

1. A wire bonding method for electrically connecting a solder wire to at least one bonding portion of a workpiece, the method comprising the steps of:
   forming an upward stream of an oxygen-free gas from below a vertically movable capillary tool, the capillary tool being capable of continuously supplying a material solder wire;
   causing a thermal melting means to form a lower ball end of the material solder wire in the oxygen-free gas stream; and
   lowering and then raising the capillary tool for bonding the lower ball end of the material solder wire to said one bonding portion of the workpiece in the oxygen-free gas stream.

2. The method according to claim 1, wherein the formation of the lower ball end for the material solder wire is performed by holding the thermal melting means for a predetermined time at a position deviating slightly from the material solder wire.

3. The method according to claim 1, wherein the formation of the lower ball end for the material solder wire is performed by slowly moving the thermal melting means from the material solder wire.

4. The method according to claim 1, further comprising the steps of:
   cutting the material solder wire to separate a solder wire segment held bonded to said one bonding portion of the workpiece and having an upper end; and
   bonding the upper end of the solder wire segment to another bonding portion of the workpiece.

5. The method according to claim 4, wherein the cutting step is performed by causing the thermal melting means to thermally cut the material solder wire in the oxygen-free gas stream so that the upper end of the solder wire segment is formed into a ball while the material solder wire is also made to have a new lower ball end, the upper ball end of the solder wire segment being bonded to said another bonding portion of the workpiece.

6. The method according to claim 5, wherein the formation of the new lower ball end for the material solder wire is performed by holding the thermal melting means for a predetermined time at a position deviating slightly from the material solder wire.

7. The method according to claim 5, wherein the formation of the new lower ball end for the material solder wire is performed by slowly moving the thermal melting means from the material solder wire.

8. The method according to claim 5, wherein the bonding of the upper ball end of the solder wire segment to said another bonding portion of the workpiece is performed in another upward stream of an oxygen-free gas.

9. The method according to claim 5, wherein the upper ball end of the solder wire segment is flattened before bonding to said another bonding portion of the workpiece.

10. The method according to claim 9, wherein the flattening of the upper ball end of the solder wire segment is performed in another stream of an oxygen-free gas.

11. The method according to claim 1, wherein the oxygen-free gas is a reducing gas.

12. The method according to claim 1, wherein the oxygen-free gas is an inert gas.

13. The method according to claim 5, wherein the upper ball end of the solder wire segment and the new lower ball end of the material solder wire are subjected to accelerated solidification by applying an oxygen-free coolant gas.

* * * * *